(12) United States Patent
Jang

(10) Patent No.: US 7,371,679 B2
(45) Date of Patent: May 13, 2008

(54) SEMICONDUCTOR DEVICE WITH A METAL LINE AND METHOD OF FORMING THE SAME

(75) Inventor: Sung-Ho Jang, Eumseong-gun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 321 days.

(21) Appl. No.: 11/320,397

(22) Filed: Dec. 29, 2005

(65) Prior Publication Data
US 2006/0141771 A1 Jun. 29, 2006

(30) Foreign Application Priority Data
Dec. 29, 2004 (KR) .................. 10-2004-0114609

(51) Int. Cl.
 H01L 21/4763 (2006.01)
 H01L 23/48 (2006.01)
(52) U.S. Cl. .............. 438/633; 438/622; 438/648; 257/750; 257/752; 257/763
(58) Field of Classification Search ............... 438/622, 438/626, 631, 633, 637, 645, 648; 257/750, 257/752, 758, 761, 763, 768
See application file for complete search history.

(56) References Cited
U.S. PATENT DOCUMENTS

| 6,235,633 B1 * | 5/2001 | Jang .................. 438/675 |
| 7,229,921 B2 * | 6/2007 | Hironaga et al. ........ 438/687 |
| 2004/0043602 A1 * | 3/2004 | Wada et al. ............ 438/631 |

* cited by examiner

*Primary Examiner*—Kevin M Picardat
(74) *Attorney, Agent, or Firm*—Lowe Hauptman Ham & Berner LLP

(57) ABSTRACT

A method of forming a metal line in a semiconductor device including forming an inter-metal dielectric (IMD) layer on the semiconductor substrate including the predetermined pattern, planarizing the IMD layer through a first CMP process, and patterning a via hole on the planarized substrate. The method further includes depositing a barrier metal layer in the via hole, filling a refractory metal in an upper part of the barrier metal layer, planarizing the substrate filled with the refractory metal by performing a second CMP process, forming a refractory metal oxide layer by oxidizing a residual refractory metal region created by the second CMP process, and forming a refractory metal plug by removing the refractory metal oxide layer through a third CMP process.

11 Claims, 2 Drawing Sheets

SEMICONDUCTOR DEVICE WITH A METAL LINE AND METHOD OF FORMING THE SAME

CROSS-REFERENCE TO RELATED APPLICATION

This application claims priority to and the benefit of Korean Patent Application No. 10-2004-0114609 filed in the Korean Intellectual Property Office on Dec. 29, 2004, the entire contents of which are incorporated herein by reference.

BACKGROUND OF THE INVENTION (a) Field of the Invention

The present invention relates to a semiconductor device with a metal line, and a method of forming the same.

(b) Description of the Related Art

FIG. 1A and FIG. 1B are cross-sectional views showing a conventional method of forming a metal line in a semiconductor device.

Firstly, as shown in FIG. 1A, an inter-metal dielectric (IMD) layer 102 is deposited on a semiconductor substrate 101 including a predetermined pattern, and then a via hole (not shown) is formed after performing a chemical mechanical planarization (CMP) process for the IMD layer. Subsequently, a barrier metal layer is deposited on an inside of the via hole, and then a tungsten plug is formed by performing a CMP process after filling the via hole with a refractory metal, such as tungsten 103.

However, when a CMP process is performed on an IMD layer, a dishing phenomenon may occur in a region that is not planarized and has a low pattern density. Therefore, residual tungsten in the region where the dishing phenomenon occurs may not be completely removed in the subsequent process. Such a dishing phenomenon may deteriorate the reliability and yield of a semiconductor device because it may cause a power failure or a bridge between metal lines in a semiconductor device.

The above information disclosed in this Background section is only for enhancement of understanding of the background of the invention and therefore it may contain information that does not form part of the prior art with respect to the present invention.

SUMMARY OF THE INVENTION

The present invention has been made in an effort to provide a semiconductor device with a metal line and a method of forming the same, in which a refractory metal oxide is formed by oxidizing a residual refractory metal remaining after a chemical mechanical planarization (CMP) process, and then the refractory metal oxide is completely removed by a subsequent CMP process. Here, the residual refractory metal is created in the region that is not planarized even after a CMP process, and it has a low pattern density.

An exemplary method of forming a metal line in a semiconductor device according to an embodiment of the present invention includes filling a substrate including a predetermined pattern with a refractory metal, planarizing the substrate filled with the refractory metal by performing a first CMP process, forming a refractory metal oxide layer by oxidizing a residual refractory metal region created by the first CMP process, and forming a refractory metal plug by removing the refractory metal oxide layer through a second CMP process.

The filling of the substrate with the refractory metal can include forming an inter-metal dielectric (IMD) layer on the semiconductor substrate including the predetermined pattern, planarizing the IMD layer through a CMP process, patterning a via hole on the planarized substrate, depositing a barrier metal layer in the via hole, and filling the refractory metal in an upper part of the barrier metal layer. The refractory metal can be tungsten (W), and the refractory metal oxide layer can include an oxide layer in which an oxidized refractory metal fills both a surface and an inside thereof. In addition, the refractory metal oxide layer is formed by oxidizing the residual refractory metal region through an electroless plating method.

DETAILED DESCRIPTION OF THE EMBODIMENTS

Figure 1A:
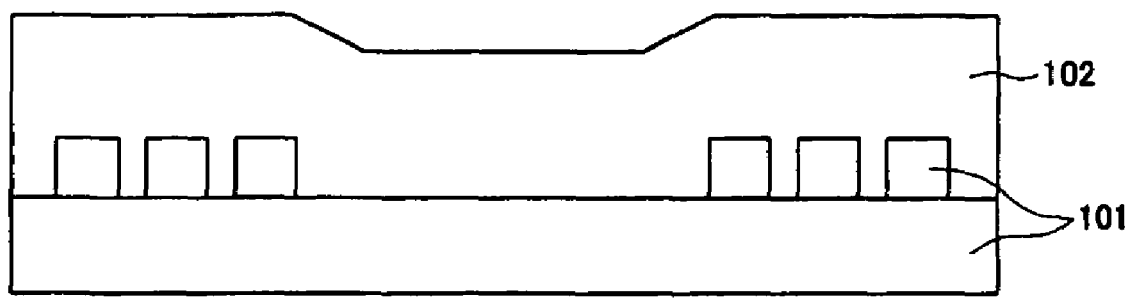
FIG. 1A and FIG. 1B are cross-sectional views showing a conventional method of forming a metal line in a semiconductor device.
Figure 1B:
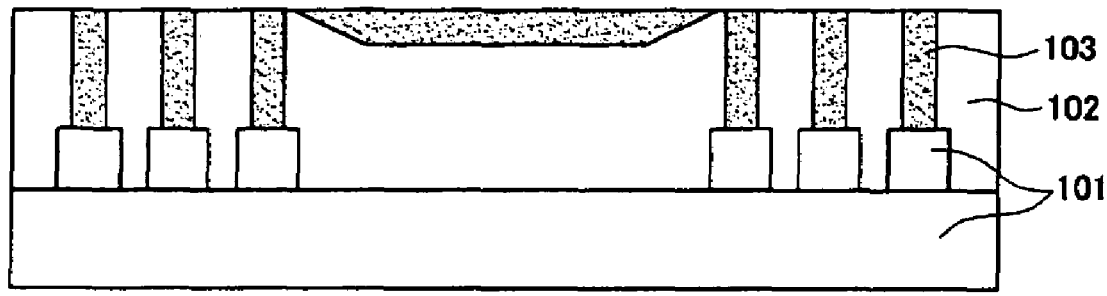

An exemplary embodiment of the present invention will hereinafter be described in detail with reference to the accompanying drawings.

With reference to the accompanying drawings, the present invention will be described in order for those skilled in the art to be able to implement the invention. As those skilled in the art would realize, the described embodiments can be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part, it means that there is no intermediate part between the two parts.

FIG. 2A to FIG. 2D are cross-sectional views showing a method of forming a metal line in a semiconductor device according to an exemplary embodiment of the present invention.

Figure 2A:
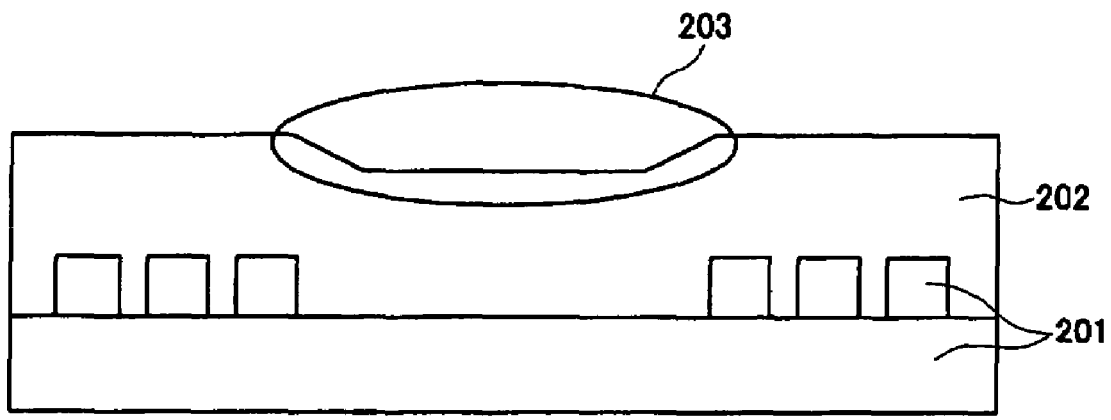
FIG. 2A to FIG. 2D are cross-sectional views showing a method of forming a metal line in a semiconductor device according to an exemplary embodiment of the present invention.

FIG. 2A shows a step of forming an IMD layer and a via hole. As shown in FIG. 2A, an IMD layer is formed on a semiconductor substrate 201 including a predetermined pattern, and then the IMD layer is planarized by a first CMP process.

Here, a dishing phenomenon occurs in a region 203 that is not planarized, and it has a low pattern density. Subsequently, the via hole (not shown) is patterned on the planarized substrate.

Figure 2B:
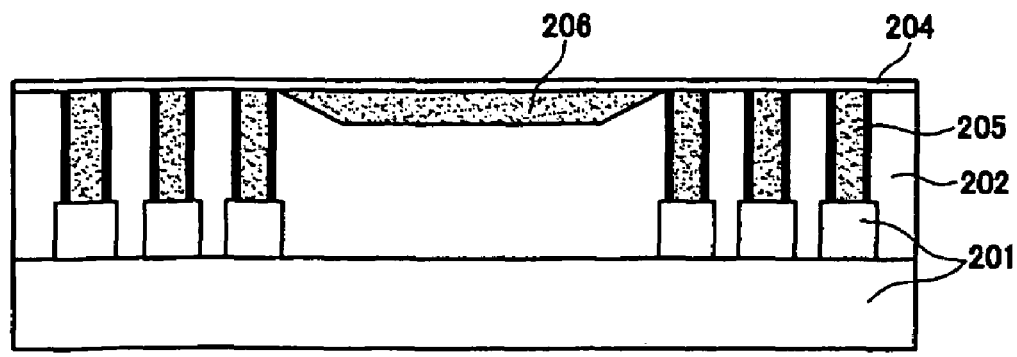

FIG. 2B shows a step of filling the via hole with a refractory metal such as tungsten 205. The refractory metal has a higher melting point than iron (Fe). Other examples of a refractory metal are Tantalum (Ta) and Molybdenum (Mo). As shown in FIG. 2B, a barrier metal layer 204 is deposited in the via hole, and tungsten fills an upper part of the barrier metal layer 204. Here, residual tungsten 206 is created in the region having a low pattern density. Subsequently, the substrate filled with the tungsten is planarized by a second CMP process.

Figure 2C:
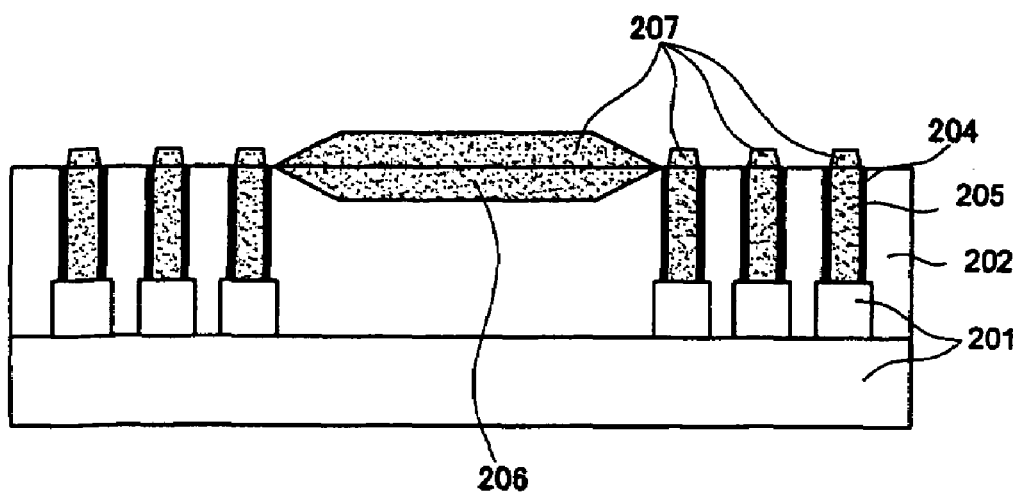

FIG. 2C shows a step of forming a tungsten oxide layer. As shown in FIG. 2C, the residual tungsten is transformed into a tungsten oxide layer 207 through an oxidation process in order to remove the residual tungsten created by the second CMP process. The oxidation process is performed by using an electroless plating method. The tungsten oxide layer may include an oxide layer in which oxidized tungsten fills both a surface and an inside thereof.

Figure 2D:
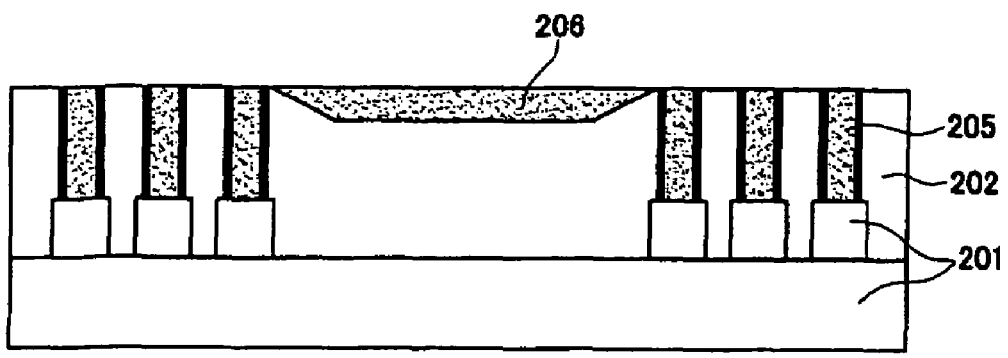

FIG. 2D shows a step of forming a tungsten plug. As shown in FIG. 2D, the tungsten plug is formed by removing the tungsten oxide layer through a third CMP process.

Therefore, according to an exemplary embodiment of the present invention, a tungsten oxide is formed by oxidizing residual tungsten remaining after a chemical mechanical planarization (CMP) process, and then the tungsten oxide is completely removed by a subsequent CMP process. The residual tungsten is created in the region which is not planarized even after a CMP process, and it has a low pattern density. Consequently, problems caused by a dishing phenomenon, such as a power failure or a bridge between metal lines, are prevented in the subsequent process, and the reliability and yield of a semiconductor device can be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a metal line in a semiconductor device, comprising:
    filling a substrate including a predetermined pattern with a refractory metal;
    planarizing the substrate filled with the refractory metal by performing a chemical mechanical planarization (CMP) process;
    forming a refractory metal oxide layer by oxidizing a residual refractory metal region created by the CMP process; and
    forming a refractory metal plug by removing the refractory metal oxide layer.

2. The method of claim 1, wherein the filling of the substrate with the refractory metal comprises:
    forming an inter-metal dielectric (IMD) layer on the semiconductor substrate including the predetermined pattern;
    planarizing the IMD layer through a CMP process;
    patterning a via hole on the planarized substrate;
    depositing a barrier metal layer in the via hole; and
    filling the refractory metal on the barrier metal layer.

3. The method of claim 1, wherein the refractory metal is tungsten.

4. The method of claim 1, wherein the refractory metal oxide layer includes an oxide layer in which an oxidized refractory metal fills both a surface and an inside thereof.

5. The method of claim 1, wherein the refractory metal oxide layer is formed by oxidizing the residual refractory metal region through an electroless plating method.

6. The method of claim 1, wherein the removal of the refractory metal oxide layer is performed by a CMP process.

7. A semiconductor device with a metal line, comprising:
    an inter-metal dielectric (IMD) layer formed on a semiconductor substrate including a predetermined pattern;
    a via hole which is patterned on the substrate after planarizing the IMD layer;
    a barrier metal layer deposited at an inside of the via hole;
    a refractory metal layer formed on the barrier metal layer;
    a refractory metal oxide layer formed by oxidizing a residual refractory metal that is left after planarizing the refractory metal layer; and
    a refractory metal plug formed by removing the refractory metal oxide layer.

8. The semiconductor device of claim 7, wherein the refractory metal is tungsten.

9. The semiconductor device of claim 7, wherein the refractory metal oxide layer includes an oxide layer in which an oxidized refractory metal fills both a surface and an inside thereof.

10. The semiconductor device of claim 7, wherein the refractory metal oxide layer is formed by oxidizing the residual refractory metal through an electroless plating method.

11. The semiconductor device of claim 7, wherein the removal of the refractory metal oxide layer is performed by a chemical mechanical planarization (CMP) process.

* * * * *